(12) United States Patent
Takahashi et al.

(10) Patent No.: US 6,448,623 B2
(45) Date of Patent: Sep. 10, 2002

(54) PIEZOELECTRIC/ELECTROSTRICTIVE FILM TYPE DEVICE

(75) Inventors: Nobuo Takahashi, Owariasahi; Mutsumi Kitagawa, Inuyama; Hirofumi Yamaguchi, Komaki, all of (JP)

(73) Assignee: NGK Insulators, Ltd., Nagoya (JP)

( * ) Notice: Subject to any disclaimer, the term of this patent is extended or adjusted under 35 U.S.C. 154(b) by 0 days.

(21) Appl. No.: 09/850,424

(22) Filed: May 7, 2001

(30) Foreign Application Priority Data

May 9, 2000 (JP) .................................... 2000-136198

(51) Int. Cl.⁷ .............................................. H01L 29/82
(52) U.S. Cl. ....................... 257/415; 257/414; 257/417; 257/418; 257/419; 257/420
(58) Field of Search ................................ 257/415, 414, 257/417, 418, 419, 420

(56) References Cited

U.S. PATENT DOCUMENTS 4,642,508 A * 2/1987 Suzuki et al. ............... 310/321
5,814,920 A * 9/1998 Takeuchi et al. ............ 310/330
5,831,651 A * 11/1998 Usui et al. ..................... 347/70
5,925,972 A * 7/1999 Shrader et al. ............. 310/338

FOREIGN PATENT DOCUMENTS

| JP | 60217711 A | * 10/1985 |
| JP | 05-267742 | 10/1993 |
| JP | 08-201265 | 8/1996 |

* cited by examiner

Primary Examiner—Nathan J. Flynn
Assistant Examiner—Remmon R. Fordé
(74) Attorney, Agent, or Firm—Burr & Brown

(57) ABSTRACT

A lower electrode 4 of a substrate 1 is continuously formed from a thin diaphragm portion 3 to a thick region 2, and independently of the lower electrode 4, an auxiliary electrode 8 is formed on the thick region 2 of the substrate 1, whereby a piezoelectric/electrostrictive film 5 is formed across the lower electrode 4 and the auxiliary electrode 8. An incomplete bonding portion of the piezoelectric/electrostrictive film 5 to the substrate 1 is eliminated on the thin diaphragm portion 3, thereby making it possible to reduce significantly a variation in vibration form.

2 Claims, 2 Drawing Sheets

FIG. 2 - Prior Art
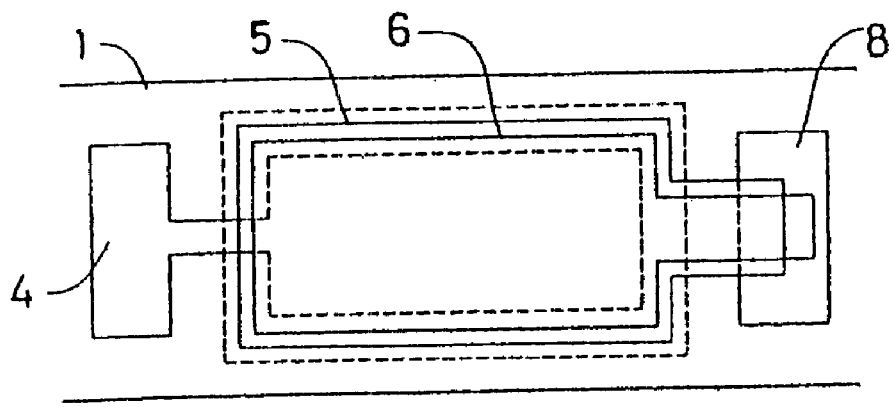
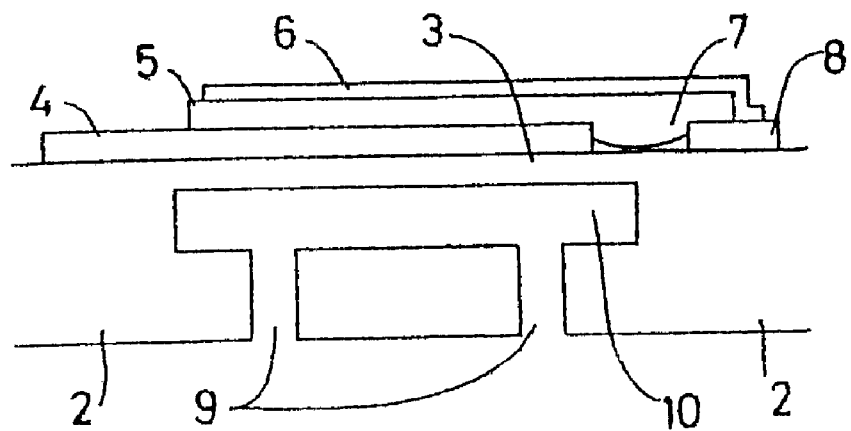

PIEZOELECTRIC/ELECTROSTRICTIVE FILM TYPE DEVICE

BACKGROUND OF THE INVENTION

1. Field of the Invention

The present invention relates to a piezoelectric/electrostrictive film type device and particularly to a piezoelectric/electrostrictive film type vibrator which is commonly employed in a microphone or a sensor for sensing the fluidity, the acoustic pressure, the weight of small level, the acceleration, and so on.

2. Description of the Related Art

Piezoelectric/electrostrictive film type devices have been used as actuators or sensors. One of such piezoelectric/electrostrictive film type devices used as a sensor is disclosed in Japanese Patent Laid-open Publication (Heisei)8-201265 which is utilized for measuring the density, the concentration, and the viscosity of a fluid. Examples of the fluid to be measured are liquid and gas, including not only single substance liquid such as water, alcohol, and oil but also solution, slurry, and paste where a soluble or non-soluble medium is dissolved, mixed, or suspended in the liquid. The device acts as a sensor utilizing the correlation between the amplitude of a piezoelectric vibrator and the viscous resistance of the fluid to the vibrator. A vibrating motion of the mechanical system of the vibrator can be replaced by an equivalent circuit of the electric system. More specifically, when the piezoelectric/electrostrictive film type vibrator vibrates in and receives a mechanical resistance from the fluid due to its viscosity, its equivalent circuit generates a change in the electrical constant which is then sensed to determine the viscosity, the density, and the concentration of the fluid. The electrical constant may be selected from loss factor, phase, resistance, reactance, conductance, susceptance, inductance, and capacitance. Particularly, the loss factor or phase which exhibits a maximum or minimum change point near the resonant frequency of the equivalent circuit may preferably be used as an index factor. This enables the measurement of not only the viscosity but also the density and the concentration of the fluid. For example, the concentration of sulfuric acid in a sulfuric acid solution may successfully be detected. It would be understood that the index factor indicative of a change in the vibrating state is not limited to the electrical constant but may be a change in the resonant frequency unless. otherwise specified in view of the measuring accuracy and the durability.

Such a piezoelectric/electrostrictive film type vibrator disclosed in Japanese Patent Laid-open Publication (Heisei) 5-267742 has an auxiliary electrode 8 provided independently of the lower electrode 4 on a substrate 1 which is made of a ceramic material and includes a thin diaphragm 3 surrounded by a thick region 2 as shown in FIG. 2. A portion of the auxiliary electrode 8 is located beneath a piezoelectric/electrostrictive film 5. The upper electrode 6 is provided extending continuously over the auxiliary electrode 8 and the piezoelectric/electrostrictive film 5 and thus the connecting reliability is improved. In FIG. 2, the fluid to be measured is contained in a cavity 10 as having been introduced from through holes 9.

It is essential for such a sensor device which detects an electrical change during the vibration not to fluctuate in electrical constant. However, its common piezoelectric/electrostrictive film type device structure for sensing the characteristics of a fluid including the acoustic pressure, the weight of small level, and the acceleration may exhibit variations of the electrical constant at the initial stage between the devices and produce a negative change with time. This requires a troublesome action of readjusting the sensor device.

SUMMARY OF THE INVENTION

We have found through a series of experiments that, as shown in FIG. 2, the conventional piezoelectric/electrostrictive film type device for a sensor has the lower electrode 4 arranged at its auxiliary electrode 8 side to extend along the diaphragm 3 and the auxiliary electrode 8 is located on the thick region 2 but not on the thin diaphragm 3, hence allowing a region of direct contact between the piezoelectric/electrostrictive film 5 and diaphragm 3 and generating an incompletely bonded region 7 over the thin diaphragm 3 and the thick region 2 due to chemical reaction and so on. It is proved for the sensor device which utilizes detection of the electrical constant during vibration, that variation or degradation with time of the incomplete bonding state at the incompletely bonded region 7 is one of the major causes for varying the vibrating motion or the electrical constant. Therefore, a piezoelectric/electrostrictive film type device according to the present invention which has a lower electrode, an auxiliary electrode, a piezoelectric/electrostrictive film, and an tipper electrode provided in layers on a substrate made of a ceramic material having a this diaphragm thereof surrounded by a thick region is provided wherein the lower electrode is arranged extending continuously from the thin diaphragm to the thick region, the auxiliary electrode is provided on the thick region at a location separated from the lower electrode, and the piezoelectric/electrostrictive film is arranged bridging between the lower electrode and the auxiliary electrode. This allows the incompletely bonded region between the piezoelectric/electrostrictive film and the substrate to be located off the thin diaphragm, thus significantly minimizing variations of the vibrating motion.

BRIEF DESCRIPTION OF THE DRAWINGS

FIG. 2 is an explanatory view of a conventional piezoelectric/electrostrictive film type vibrator for a sensor.

DETAILED DESCRIPTION OF THE PREFERRED EMBODIMENTS

Figure 1:
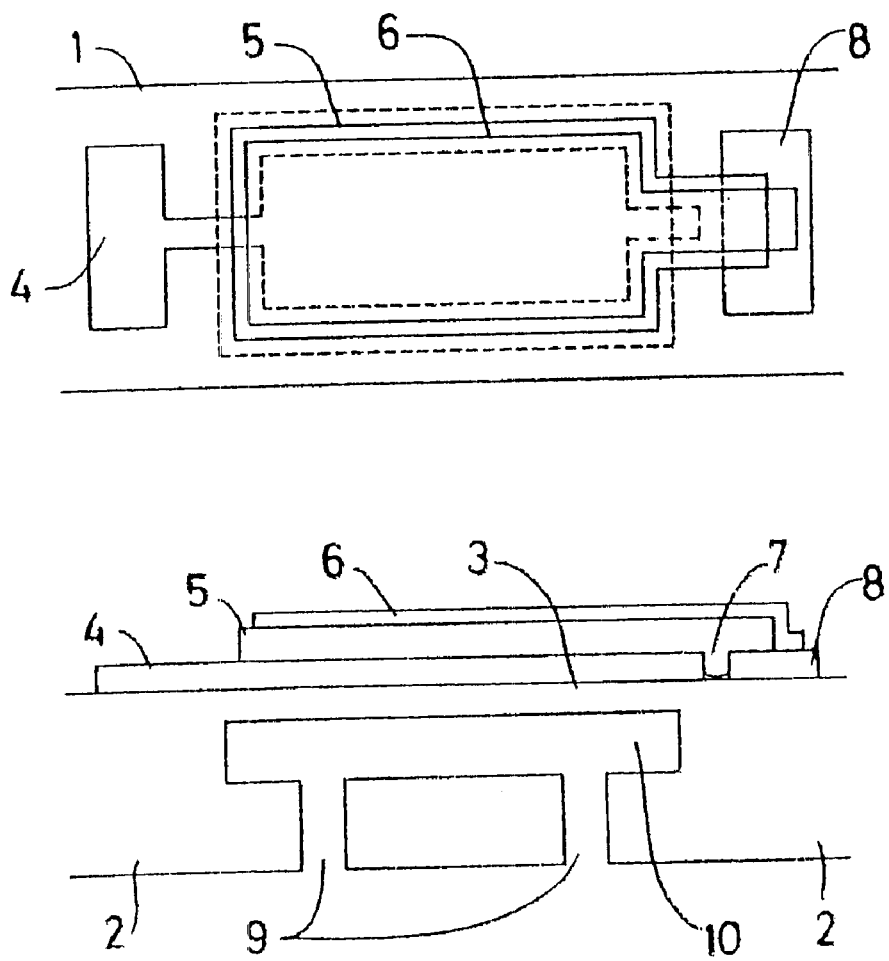
FIG. 1 is an explanatory view of an embodiment of a piezoelectric/electrostrictive film type vibrator for a sensor according to the present invention.

FIG. 1 illustrates an embodiment of a piezoelectric/electrostrictive film type vibrator for a sensor according to the present invention. The piezoelectric/electrostrictive film type vibrator is fabricated in a integrated structure having a lower electrode 4, a piezoelectric/electrostrictive film 5, and an upper electrode 6 provided in layers by an ordinary method for film formation on a ceramic substrate 1 which comprises a thin diaphragm 3 and a thick region 2. One end at the auxiliary electrode side of the lower electrode 4 extends lengthwisely across the thin diaphragm 3 to a predetermined location. An auxiliary electrode 8 is provided separately on the same plane of the lower electrode 4 to extend to under the piezoelectric/electrostrictive film 5. The piezoelectric/electrostrictive film 5 is arranged bridging between the lower electrode 4 and the auxiliary electrode 8. The upper electrode 6 is arranged covering on the piezoelectric/electrostrictive film 5 and the auxiliary electrode 8 while electrically connecting with the auxiliary electrode 8. An incompletly bonded region 7 is located on the thick region 2 of the substrate 1.

The ceramic substrate 1 may preferably be made of a ceramic material which has resistivity to heat, chemical stability, and electrical insulation. This allows any of the lower electrode 4, the piezoelectric/electrostrictive film 5, and the upper electrode 6 to be bonded by heat treatment with no use of an adhesive, and the liquid of which the characteristics are sensed with the piezoelectric/electrostrictive film type vibrator to have a electrical conductivity and a degree of corrosion.

Characteristic examples of the ceramic material are stabilized zirconium oxide, aluminum oxide, magnesium oxide, mullite, aluminum nitride, silicon nitride, and glass. Stabilized zirconium oxide can provide a higher level of mechanical strength and a degree of toughness when the diaphragm is reduced in the thickness, thus being most preferable.

The thickness of the thin diaphragm 3 of the ceramic substrate 1 may be not thicker than 50 $\mu$m, preferably not thicker than 30 $\mu$m, and more preferably not thicker than 15 $\mu$m for not interrupting the vibration of the piezoelectric/electrostrictive film 5. The shape of the diaphragm 3 may be selected from a rectangle, a square, a triangle, an oval, a circle, and any other appropriate shape. For simplification of a motion at the resonance mode excited in the sensor device, a rectangular or circular shape will preferably be used.

The lower electrode 4 is provided on the surface of the ceramic substrate 1. The lower electrode 4 extends throughout its length from one end to the other end of the ceramic substrate 1 across the thin diaphragm 3 as is slightly smaller than the area where it is exposed to the piezoelectric/electrostrictive film 5.

The auxiliary electrode 8 is also provided on the surface of the ceramic substrate 1 as extending from the other end opposite to the lower electrode 4 of the ceramic substrate 1 towards the lower electrode 4. The auxiliary electrode 8 is spaced at its distal end by the length from the lower electrode 4 while extends to under the piezoelectric/electrostrictive film 5. According to the present invention, the auxiliary electrode 8 is provided never on the thin diaphragm 3. The other end of the auxiliary electrode 8 serves as a lead terminal.

The lower electrode 4 and the auxiliary electrode 8 may be made of either one material or different materials which are high in both the electrical conductivity and the matching with the ceramic substrate 1 and the piezoelectric/electrostrictive film 5. More specifically, characteristic examples of the electrode material are platinum, palladium, rhodium, silver, and their alloy. Preferably, when the piezoelectric/ electrostrictive film is treated at a high temperature, platinum or its alloy may be used.

The lower electrode 4 and the auxiliary electrode 8 are developed by an ordinary method for film formation. Characteristic examples of the known method are ion beam, sputtering, vacuum deposition, CVD, ion plating, and metal plating of the thin-film forming process and screen printing, spraying, and dipping of the thick-film forming process. Preferably, the sputtering and the screen printing may be used.

The piezoelectric/electrostrictive film 5 is arranged bridging between lower electrode 4 and the auxiliary electrode 8. The piezoelectric/electrostrictive film 5 may be made of any material which exhibits the piezoelectric/electrostrictive effect. Such the piezoelectric/electrostrictive materials are: lead-based ceramic piezoelectric/electrostrictive materials such as lead zirconate, lead titanate, or lead zirconate titanate (PZT); titanium/barium-based ceramic ferroelectric materials including barium titanate; piezoelectric polymers such as polyvinylidene fluoride (PVDF); and Bi piezoelectric ceramics such as $(Bi_{0.5}Na_{0.5})TiO_3$. It is also possible to use their mixture, solid solution, and doped material which are improved in the piezoelectric/electrostrictive effect. The PZT piezoelectric/electrostrictive materials are high in the piezoelectric property and can preferably be used as the material of a highly sensitive sensor. When the lower electrode and the auxiliary electrode are made of platinum or its alloy, the piezoelectric material may preferably be selected from $(Bi_{0.5}Na_{0.5})TiO_3$, $BaTiO_3$, as a main component which have a higher bonding strength to the electrode material.

The piezoelectric/electrostrictive film 5 made of such a piezoelectric/electrostrictive material can be developed by the same ordinary method as of the lower electrode 4 and the auxiliary electrode 8. Preferably, the screen printing may be used in view of the reduction of cost.

The piezoelectric/electrostrictive film 5 is then subjected to heat treatment, if desired, for bonding together with the lower electrode 4 and the auxiliary electrode 8. According to the present invention, when the piezoelectric/electrostrictive film 5 is mainly made of $(Bi_{0.5}Na_{0.5})TiO_3$ or $BaTiO_3$, it is heated up to a temperature ranging from 900° C. to 1400° C. or preferably from 1000° C. to 1300° C. for improving the strength of bonding between the piezoelectric/electrostrictive film 5 and the lower electrodes 4 and auxiliary electrodes 8 which are made of platinum or the like, decreasing variations of the characteristic of the device, and enhancing the reliability. When the film is made of a PZT material, it is heated to the same level of the temperature. Simultaneously, it is desired for preventing the piezoelectric/electrostrictive film 5 from being unstable to control the operating atmosphere using the source of evaporation of the piezoelectric/electrostrictive material during the heat treatment.

The upper electrode 6 is deposited on the piezoelectric/electrostrictive film 5 as continuously bridging between the piezoelectric/electrostrictive film 5 and the auxiliary electrode 8.

The upper electrode 6 may be made of an electrically conductive material which has a higher bonding strength to the piezoelectric/electrostrictive film 5 and formed by the same method as of the lower electrode 4 and the auxiliary electrode 8.

The upper electrode 6 is also heated up if desired after the formation and bonded together with the piezoelectric/electrostrictive film 5 and the auxiliary electrode 8 to form a integrated structure. It would be understood that the upper electrode 6 like the lower electrode 4 is not necessarily subjected to the heat treatment.

If the lower electrode 4, the piezoelectric/electrostrictive film 5, and the upper electrode 6 are bonded together through the heat treatment, they may be heated up separately at their formation or at one time after their formation. It is also appreciated for providing a higher bonding strength and inhibiting degradation by diffusion of the elements in the heat treatment to select an optimum degree of the heating temperature. While the cavity 10 is communicated with the through holes 9 shown in FIG. 1, and comes into direct contact with a fluid, an arrangement at the downstream of the cavity 10 is their shape and arrangement are of no limitations and may be determined by any means.

The piezoelectric/electrostrictive film type vibrator defined in claim 1 of the present invention has a specific structure where an incompletly boned region does not exists on the thin diaphragm. Accordingly, the vibrator is free from variation in the vibration or degradation with time and can favorably be used as a device for identifying the characteristics of a fluid or between liquid and gas through detection of the electrical constant during the vibration or a device for measuring the acoustic pressure, the weight of small level, and the acceleration.

As the symmetry of the lower electrode over the thin diaphragm is enhanced as higher as possible, the vibrating action can be stable without variations thus improving its characteristics.

What is claimed is:

1. A piezoelectric/electrostrictive film type sensor device having a lower electrode, an auxiliary electrode, a piezoelectric/electrostrictive film, and an upper electrode provided in layers on a substrate made of a ceramic material having a thin diaphragm thereof surrounded by a thick region, wherein:

the lower electrode is arranged extending continuously across the entire thin diaphragm onto a portion of the thick region, the auxiliary electrode is provided on the thick region at a location separated from the lower electrode, and the piezoelectric/electrostrictive film is arranged bridging between the lower electrode and the auxiliary electrode.

2. A piezoelectric/electrostrictive film type device according to claim 1, wherein said piezoelectric/electrostrictive film is arranged on and extends across a portion of the lower electrode onto a top portion of the auxiliary electrode.

* * * * *